United States Patent
Pillarisetty et al.

(10) Patent No.: US 11,342,327 B2
(45) Date of Patent: May 24, 2022

(54) STACKED TRANSISTOR LAYOUT

(71) Applicant: Intel Corporation, Santa Clara, CA (US)

(72) Inventors: Ravi Pillarisetty, Portland, OR (US); Willy Rachmady, Beaverton, OR (US); Abhishek A. Sharma, Hillsboro, OR (US); Gilbert Dewey, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 16/650,825

(22) PCT Filed: Dec. 28, 2017

(86) PCT No.: PCT/US2017/068756
§ 371 (c)(1),
(2) Date: Mar. 25, 2020

(87) PCT Pub. No.: WO2019/132927
PCT Pub. Date: Jul. 4, 2019

(65) Prior Publication Data
US 2020/0279847 A1  Sep. 3, 2020

(51) Int. Cl.
*H01L 27/092* (2006.01)
*H01L 21/8238* (2006.01)
(Continued)

(52) U.S. Cl.
CPC .. *H01L 27/0922* (2013.01); *H01L 21/823871* (2013.01); *H01L 23/535* (2013.01); *H01L 27/1104* (2013.01)

(58) Field of Classification Search
CPC ......... H01L 27/0922; H01L 21/823871; H01L 23/535; H01L 27/1104; H01L 21/823821;
(Continued)

(56) References Cited

U.S. PATENT DOCUMENTS 5,095,347 A  3/1992 Kirsch
6,201,267 B1  3/2001 Gupta et al.
(Continued)

OTHER PUBLICATIONS

International Search Report and Written Opinion from PCT/US2017/068756 dated Sep. 28, 2018, 14 pgs.
(Continued)

*Primary Examiner* — Karen Kusumakar
*Assistant Examiner* — Adam S Bowen
(74) *Attorney, Agent, or Firm* — Essential Patents Group, LLP

(57) ABSTRACT

An apparatus is provided which comprises: a first transistor body comprising one or more semiconductor materials and having a length comprising a source region and a drain region with a channel region therebetween, a first dielectric layer over the first transistor body, a second transistor body comprising one or more semiconductor materials and having a length comprising a source region and a drain region with a channel region therebetween, wherein the second transistor body is over the first dielectric layer and wherein the length of the second transistor body is non-parallel to the length of the first transistor body, and a gate coupled with the channel regions of both the first transistor body and the second transistor body. Other embodiments are also disclosed and claimed.

20 Claims, 13 Drawing Sheets

(51) Int. Cl.
*H01L 23/535* (2006.01)
*H01L 27/11* (2006.01)

(58) Field of Classification Search
CPC ............. H01L 27/0924; H01L 27/0688; H01L 21/8221
See application file for complete search history.

(56) References Cited

U.S. PATENT DOCUMENTS

| | | | |
|---|---|---|---|
| 6,657,259 B2 * | 12/2003 | Fried | H01L 21/845 257/347 |
| 2007/0241400 A1 * | 10/2007 | Nagai | H01L 27/1203 257/347 |
| 2009/0050941 A1 * | 2/2009 | Yamazaki | H01L 27/1203 257/255 |
| 2012/0018808 A1 | 1/2012 | Isobe | |
| 2016/0197069 A1 | 7/2016 | Morrow et al. | |
| 2016/0276350 A1 | 9/2016 | Zang et al. | |

OTHER PUBLICATIONS

International Preliminary Report on Patentability from PCT/US2017/068756 dated Jul. 9, 2020, 11 pgs.

* cited by examiner

STACKED TRANSISTOR LAYOUT

CLAIM OF PRIORITY

This Application is a National Stage Entry of, and claims priority to, PCT Application No. PCT/US2017/068756, filed on Dec. 28, 2017 and titled "STACKED TRANSISTOR LAYOUT", which is incorporated by reference in its entirety for all purposes.

BACKGROUND

In semiconductor devices, as transistor dimensions continue to shrink, routing of electrical contacts can become more complicated. In complementary metal-oxide-semiconductor (CMOS) devices, such as SRAM cells for example, many NMOS and PMOS transistors need to be formed in close proximity with contacts coupling with each source, drain, and gate. Conventional layout designs have had transistor bodies parallel with each other with contacts running orthogonally, which may present problems with further scaling down of dimensions as adequate spacing between transistors needs to be maintained. Furthermore, if the NMOS transistor bodies and PMOS transistor bodies are stacked directly on top of each other, establishing contacts to a buried transistor could be prohibitively difficult. As such, existing techniques do not provide transistor layouts that can be effectively scaled and easily manufactured to keep pace with increasing demands for highly integrated devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
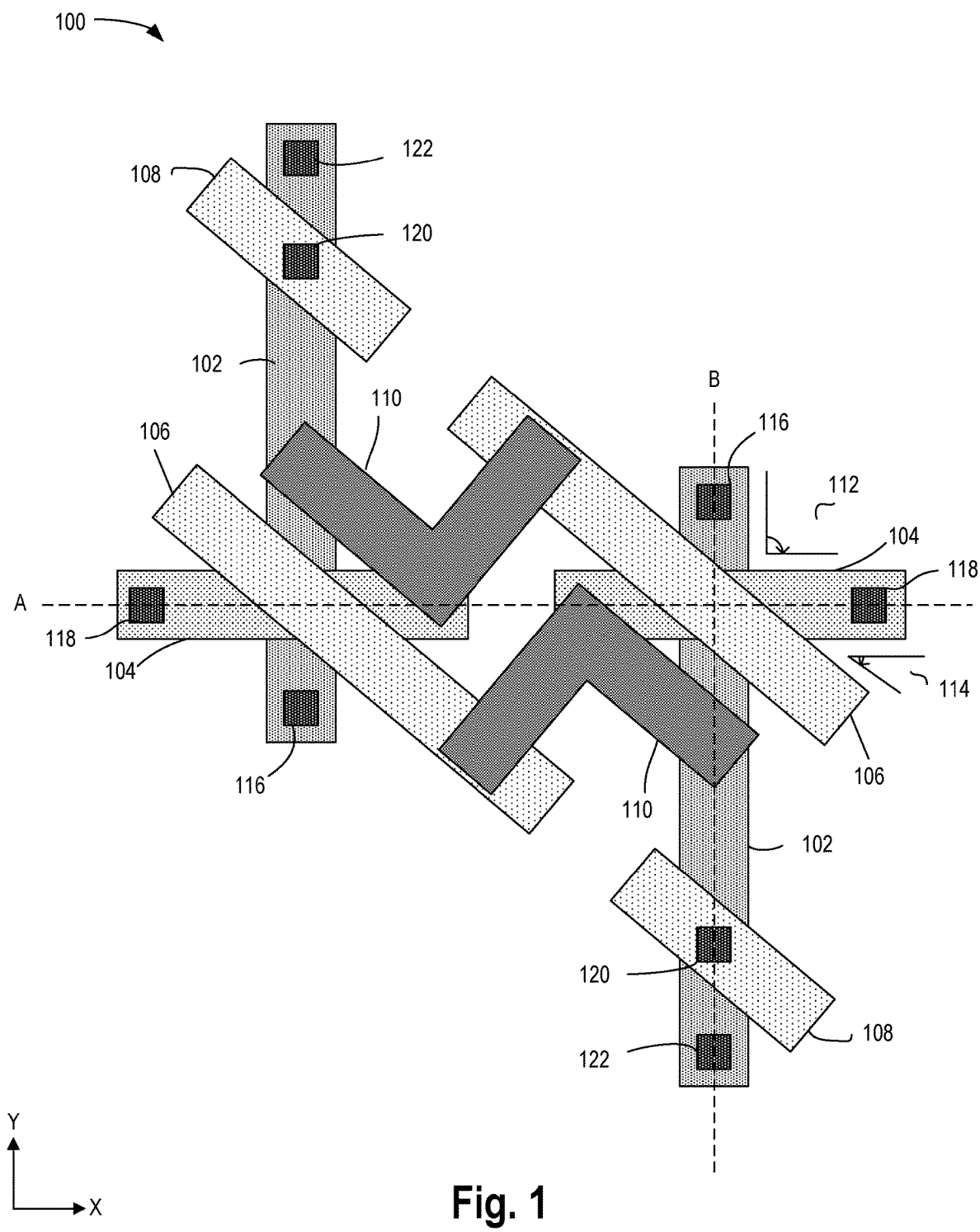
FIG. 1 illustrates a plan view of an example stacked transistor layout, according to some embodiments.

A stacked transistor layout is generally presented. In this regard, embodiments of the present disclosure may enable CMOS transistors to be stacked on top of each other at different orientations. The footprint efficiency that results from the stacking of CMOS transistors in this way may lead to further scaling down of feature sizes. One skilled in the art would appreciate that this approach may enable smaller, more highly integrated semiconductor devices.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a plan view of an example stacked transistor layout, according to some embodiments. As shown, device 100 includes transistor bodies 102, transistor bodies 104, gates 106 and 108, interconnects 110, transistor body angle 112, gate angle 114, and contacts 116, 118, 120, and 122. In some embodiments, device 100 may represent a six transistor SRAM cell, for example, similar to the circuit described hereinafter in reference to FIG. 12.

Transistor bodies 102 and transistor bodies 104 may be fins that reside on different planes, as shown in more detail hereinafter, separated by dielectric material. While transistor bodies 104 are shown as being stacked over transistor bodies 102, in some embodiments, the order of stacking may be reversed. Transistor bodies 102 and transistor bodies 104 may contain the same or different semiconductor materials, including, but not limited to, InGaAs, InAs, InGaAs, InGaAsSb, InSb, GaSb, Ge, Si, or SiGe. In some embodiments, transistor bodies 102 may be doped with an n-type dopant, such as phosphorus or arsenic or the like, while transistor bodies 104 may be doped with a p-type dopant, such as boron or the like.

Transistor bodies 102 may have a length that includes two NMOS transistors, each including a source region, a drain region, and a channel therebetween. In some embodiments, a pull-down transistor may include a drain region coupled with a ground through contact 116 and an access transistor, or pass gate, which may be controlled by a word line through contact 120, may include a source region coupled with a bit line through contact 122. In some embodiments, transistor bodies 102 are parallel to each other and offset by about 50%. In other words, an end of one transistor body 102 may be coplanar with close to a midpoint of an adjacent transistor body 102.

Transistor bodies 104 may have a length that includes a PMOS transistor, including a source region, a drain region, and a channel therebetween. In some embodiments, a pull-up transistor may include a source region coupled with a voltage source through contact 118. Transistor bodies 104 may be oriented apart from transistor bodies 102 by transistor body angle 112. In some embodiments, transistor body angle 112 is 90 degrees. In some embodiments, transistor bodies 104 are coaxial with each other, while in other embodiments, transistor bodies 104 may be offset from each other.

Gates 106 and 108 may be polycrystalline silicon or metal and may contact transistor bodies 102 and 104 at channel regions. Gate 106 may be formed around transistor bodies 104, as shown in more detail hereinafter, and extend between transistor bodies 102 and 104 near an intersection between transistor bodies 102 and transistor bodies 104. Gates 106 and 108 may each have a longitudinal axis that is oriented with transistor bodies 104 at a gate angle 114, which in some embodiments is about 45 degrees.

Interconnects 110 may each couple a source/drain midpoint of transistor body 102 with a drain region of transistor body 104 and with gate 106. In some embodiments, lines of interconnects 110 may be parallel with gates 106. While shown as having an elbow shape with a right angle, in some embodiments, interconnects 110 may have other shapes and/or angles.

Figure 2:
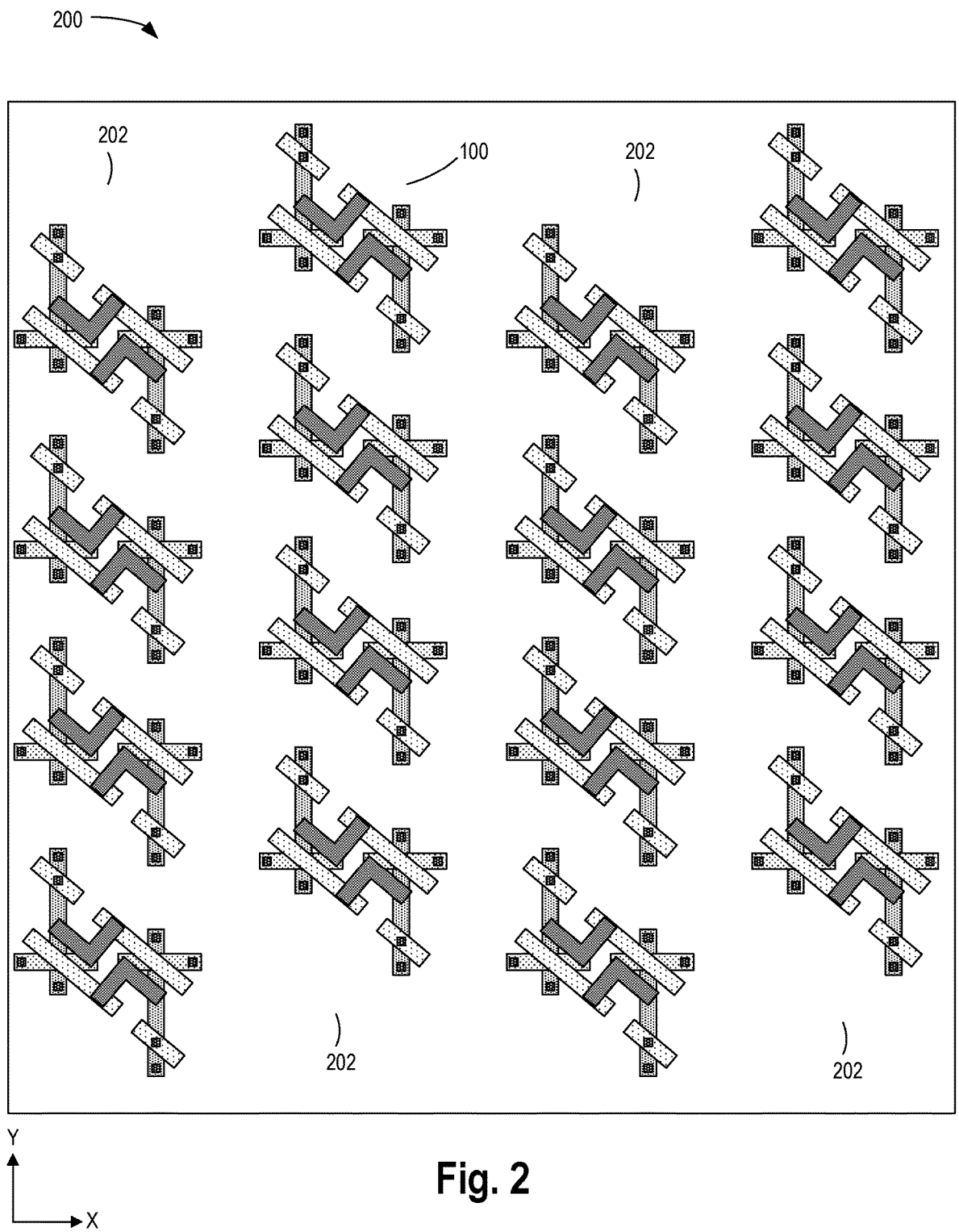
FIG. 2 illustrates a plan view of an example device integrating a stacked transistor layout, according to some embodiments.

FIG. 2 illustrates a plan view of an example device integrating a stacked transistor layout, according to some embodiments. As shown, device 200 may integrate many instances of device 100 with interconnect routing (not shown), While shown as including devices 100 arranged in straight columns 202 and in staggered rows, in some embodiments, device 200 may include devices 100 arranged in staggered columns and straight rows. In other embodiments, device 200 may include devices 100 arranged in straight columns and straight rows or in staggered columns and staggered rows, or in some other arrangement. In some embodiments, device 200 may be a memory device, such as an SRAM component. In other embodiments, device 200 may represent a portion of an integrated circuit device, such as a processor or controller, for example.

Figure 3A:
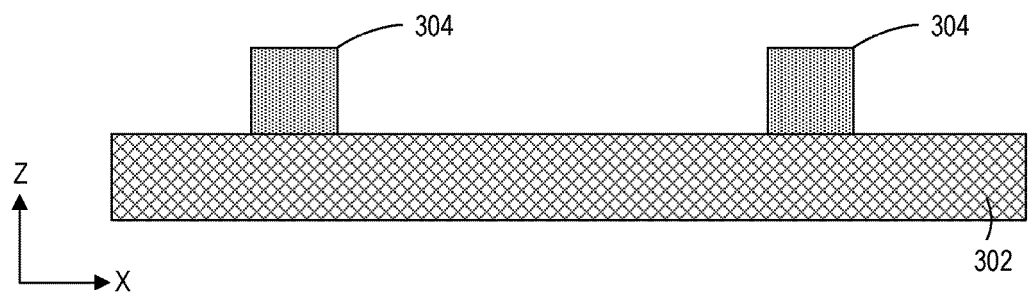
FIGS. 3A & 3B illustrate cross-sectional views of partially formed semiconductor devices with a stacked transistor layout, according to some embodiments.
Figure 3B:
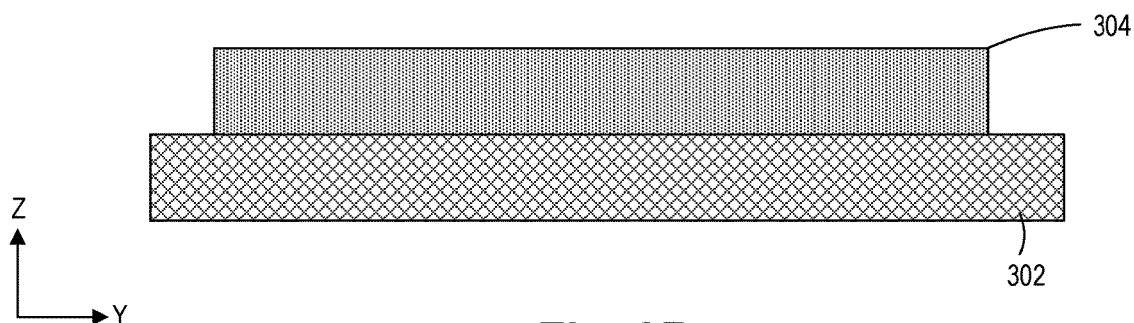

FIGS. 3A & 3B illustrate cross-sectional views of partially formed semiconductor devices with a stacked transistor layout, according to some embodiments. FIGS. 3A & 3B may represent a manufacturing assembly of device 100 as viewed along planes A and B, respectively. As shown, assembly 300 may include substrate 302 and transistor bodies 304.

In some embodiments, substrate 302 comprises at least one layer of undoped semiconductor, such as Ge, Si, SiGe, InGaAs, AlSb, etc. Substrate 302 may be composed of one or more semiconductor material layers on top of another semiconductor material such as silicon.

Transistor bodies 304 may be semiconductor fins formed by any suitable technique, including, for example, epitaxially growth or regrowth. In some embodiments, transistor bodies 304 contain n-type semiconductor material. Transistor bodies 304 may include additional n-type dopants in areas that are designed to serve as source/drain regions. Additionally, oxide may be deposited or grown on transistor bodies 304 to serve as a gate dielectric (not shown).

Figure 4A:
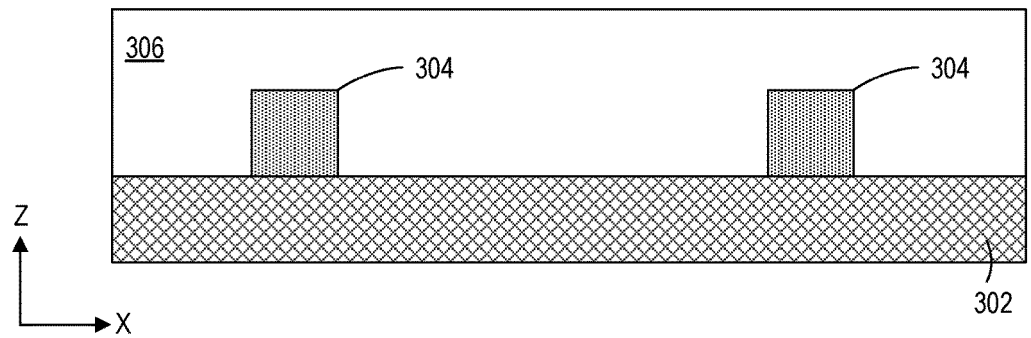
FIGS. 4A & 4B illustrate cross-sectional views of partially formed semiconductor devices with a stacked transistor layout, according to some embodiments.
Figure 4B:
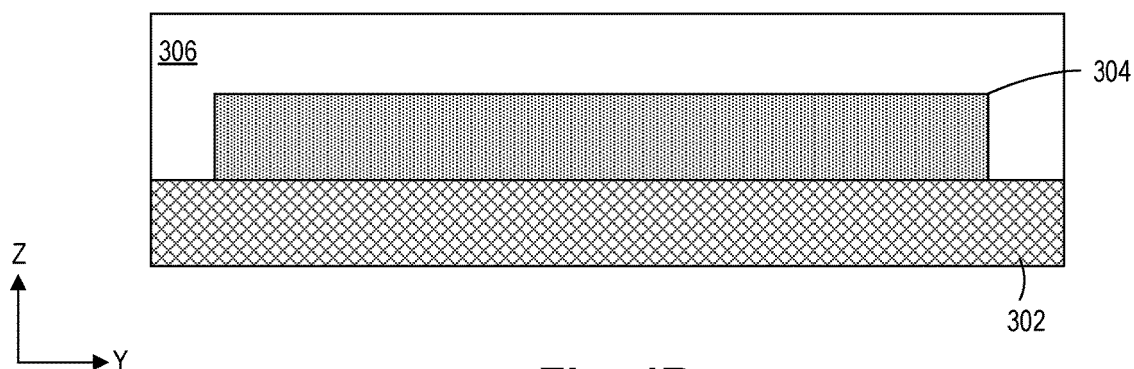

FIGS. 4A & 4B illustrate cross-sectional views of partially formed semiconductor devices with a stacked transistor layout, according to some embodiments. FIGS. 4A & 4B may represent a manufacturing assembly of device 100 as viewed along planes A and B, respectively. As shown, assembly 400 may represent assembly 300 after further processing steps.

Dielectric 306 may represent an interlayer dielectric, such as, for example, silicon dioxide. In some embodiments, dielectric 306 may be deposited by known deposition techniques, such as atomic layer deposition (ALD).

Figure 5A:
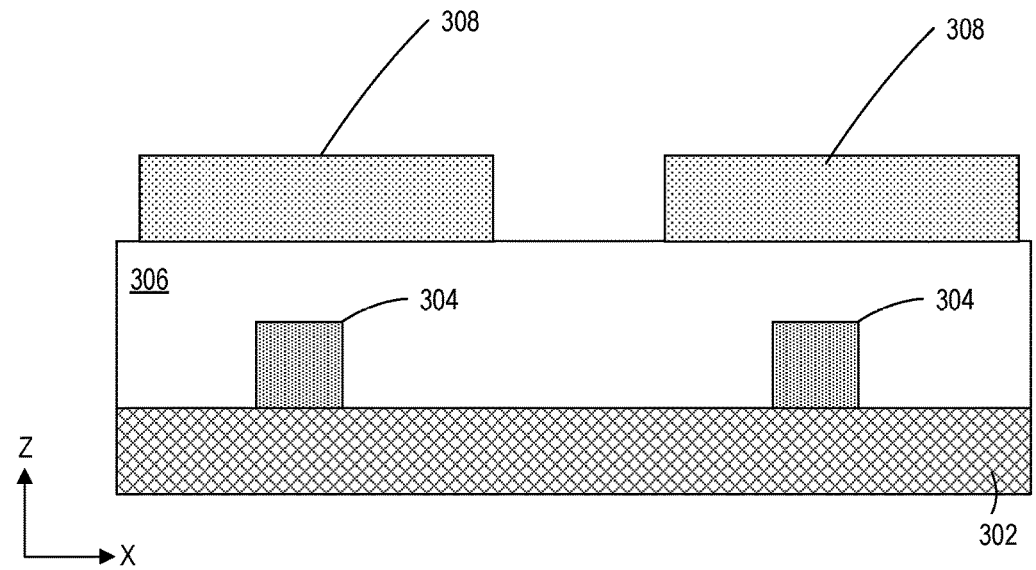
FIGS. 5A & 5B illustrate cross-sectional views of partially formed semiconductor devices with a stacked transistor layout, according to some embodiments.
Figure 5B:
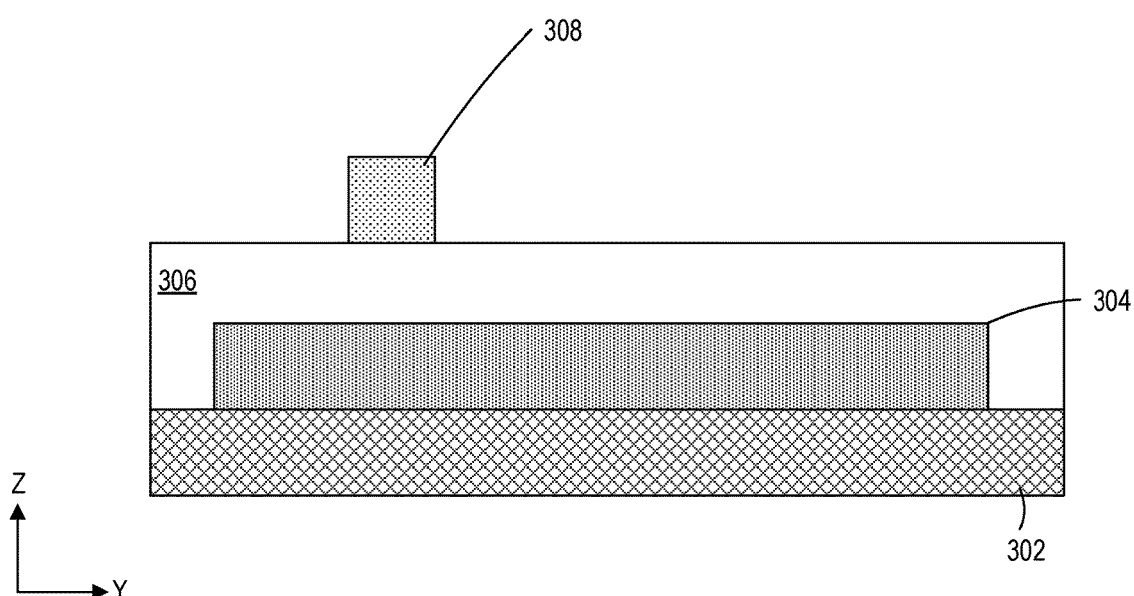

FIGS. 5A & 5B illustrate cross-sectional views of partially formed semiconductor devices with a stacked transistor layout, according to some embodiments. FIGS. 5A & 5B may represent a manufacturing assembly of device 100 as viewed along planes A and B, respectively. As shown, assembly 500 may represent assembly 400 after further processing steps.

Transistor bodies 308 may be semiconductor fins formed by any suitable technique, including, for example, epitaxially growth or regrowth. In some embodiments, transistor bodies 308 contain p-type semiconductor material. Transistor bodies 308 may include additional p-type dopants in areas that are designed to serve as source/drain regions. Additionally, oxide may be deposited or grown on transistor bodies 308 to serve as a gate dielectric (not shown).

Figure 6A:
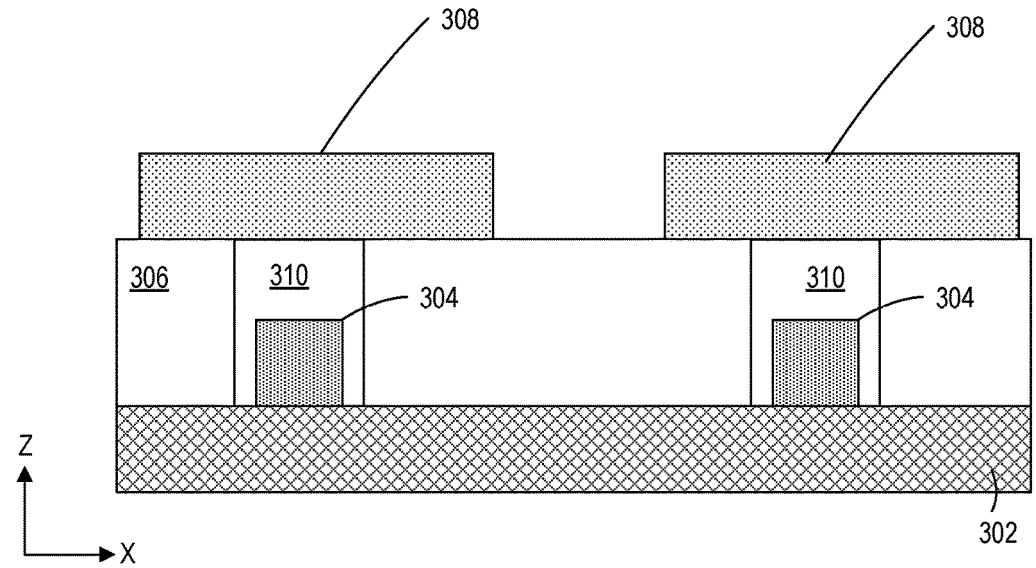
FIGS. 6A & 6B illustrate cross-sectional views of partially formed semiconductor devices with a stacked transistor layout, according to some embodiments.
Figure 6B:
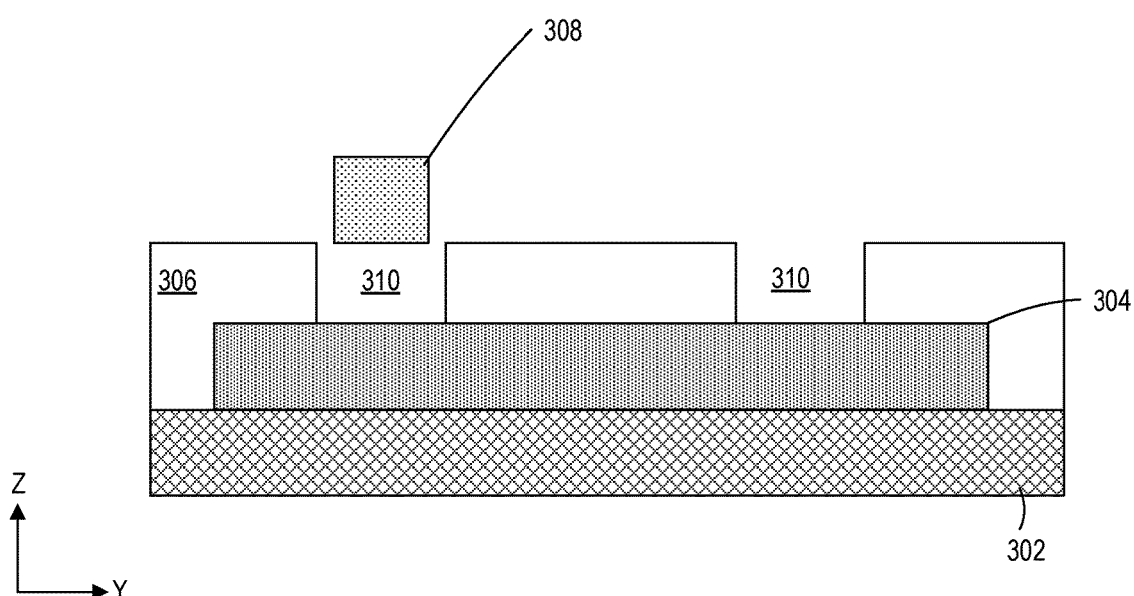

FIGS. 6A & 6B illustrate cross-sectional views of partially formed semiconductor devices with a stacked transistor layout, according to some embodiments. FIGS. 6A & 6B may represent a manufacturing assembly of device 100 as viewed along planes A and B, respectively. As shown, assembly 600 may represent assembly 500 after further processing steps.

Voids 310 may be formed through dielectric 306 around areas of transistor bodies 304 that are designed to serve as channel regions. Voids 310 may be formed by any suitable technique, including, but not limited to a selective chemical etch that may remove dielectric 306 without removing transistor bodies 304 or 308.

Figure 7A:
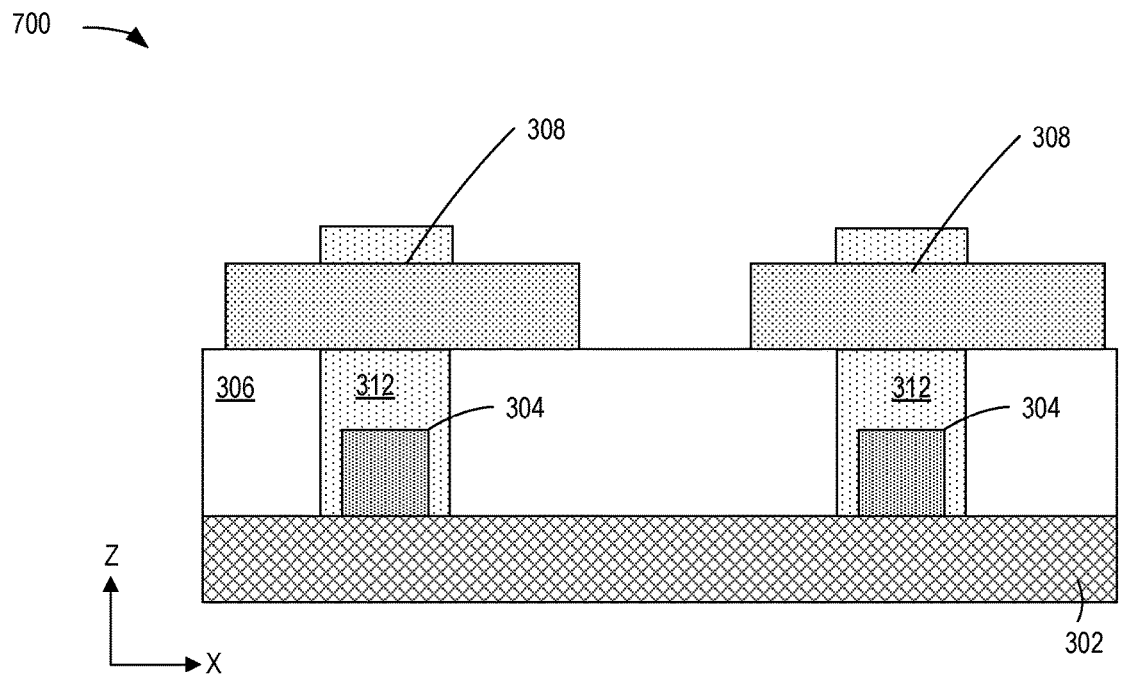
FIGS. 7A & 7B illustrate cross-sectional views of partially formed semiconductor devices with a stacked transistor layout, according to some embodiments.
Figure 7B:
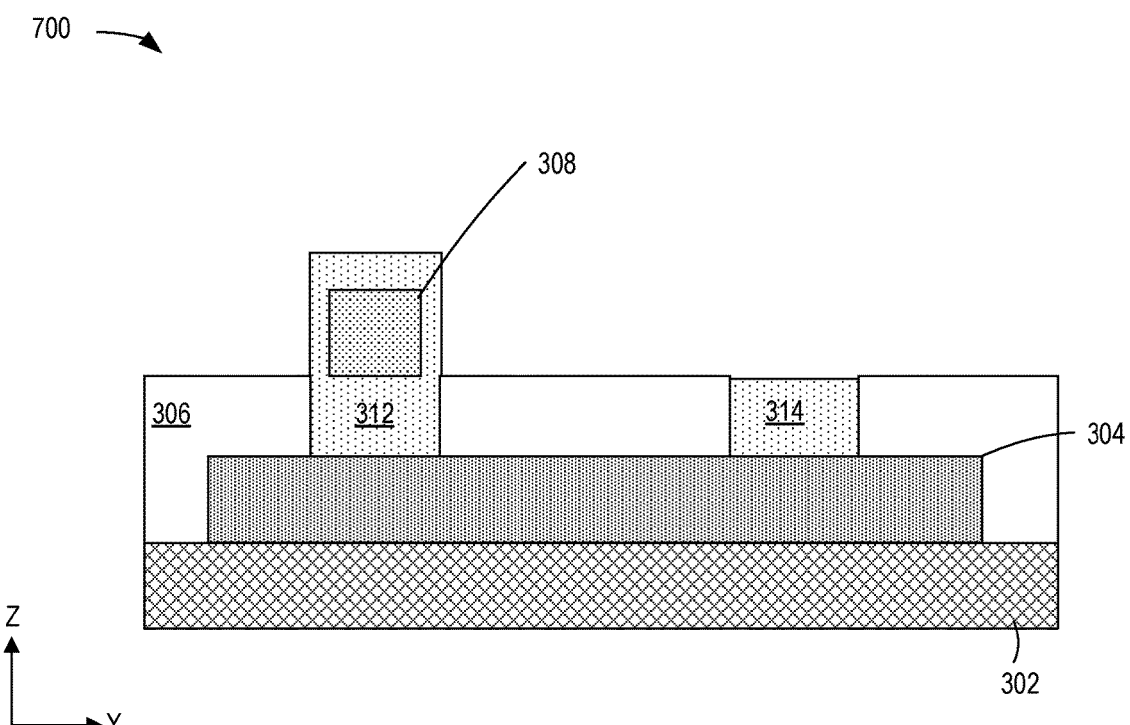

FIGS. 7A & 7B illustrate cross-sectional views of partially formed semiconductor devices with a stacked transistor layout, according to some embodiments. FIGS. 7A & 7B may represent a manufacturing assembly of device 100 as viewed along planes A and B, respectively. As shown, assembly 700 may represent assembly 600 after further processing steps.

Gates 312 and 314 may fill voids 310 with polycrystalline silicon or metal and contact gate dielectric previously formed on transistor bodies 304, In some embodiments, gates 312 also wrap around, and contact gate dielectric previously formed on, transistor bodies 308, while in other embodiments gates 312 might not fully wrap around transistor bodies 308.

Figure 8A:
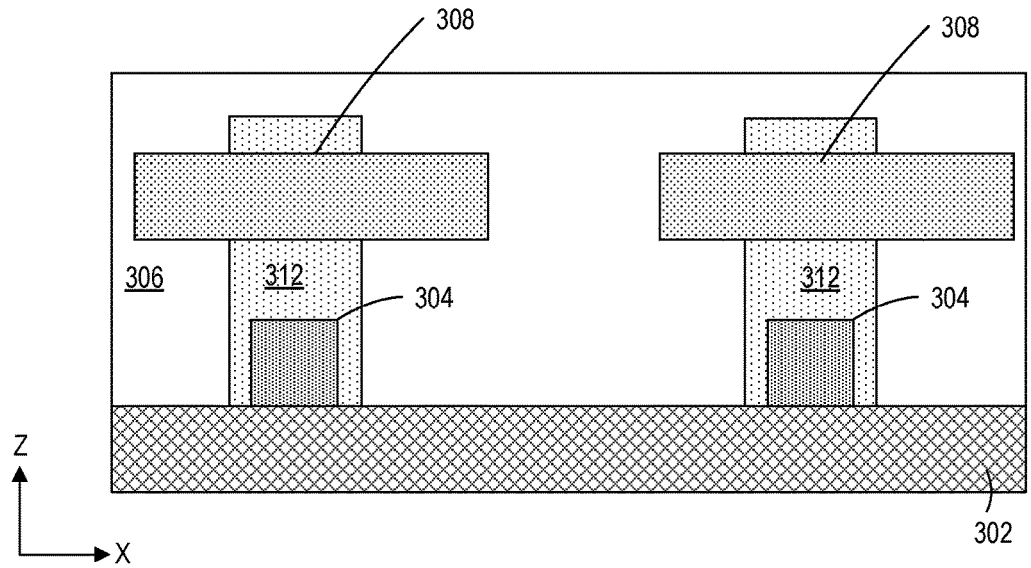
FIGS. 8A & 8B illustrate cross-sectional views of partially formed semiconductor devices with a stacked transistor layout, according to some embodiments.
Figure 8B:
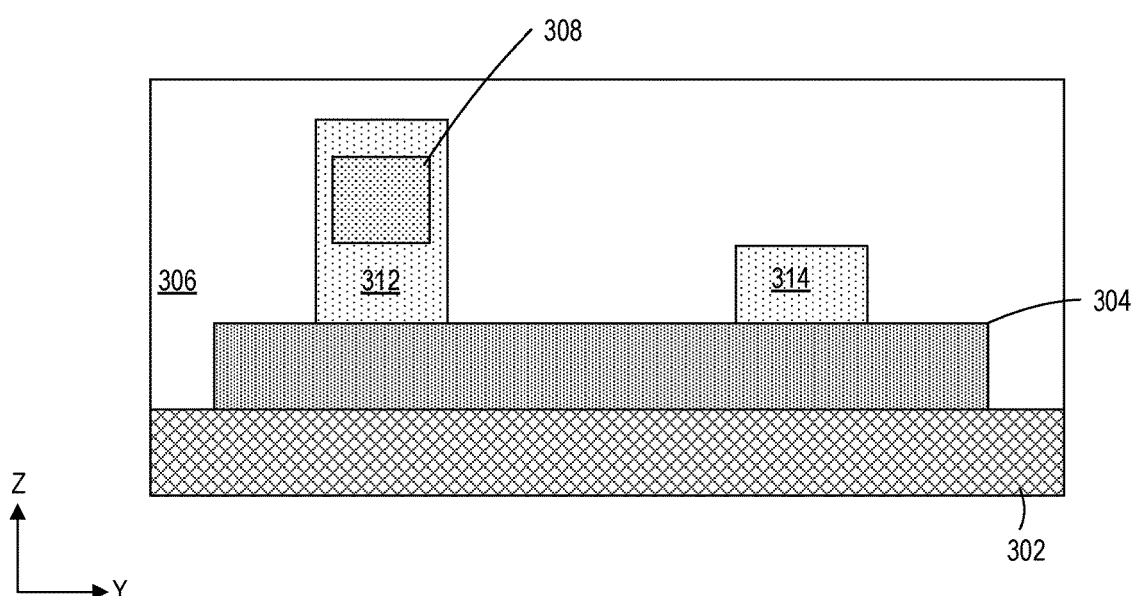

FIGS. 8A & 8B illustrate cross-sectional views of partially formed semiconductor devices with a stacked transistor layout, according to some embodiments. FIGS. 8A & 8B may represent a manufacturing assembly of device 100 as viewed along planes A and B, respectively. As shown, assembly 800 may represent assembly 700 after further processing steps.

Further dielectric 306 may be deposited to cover transistor bodies 308 and gates 312 and 314. In some embodiments, silicon dioxide may be deposited by any suitable technique, including, but not limited to, ALD.

Figure 9A:
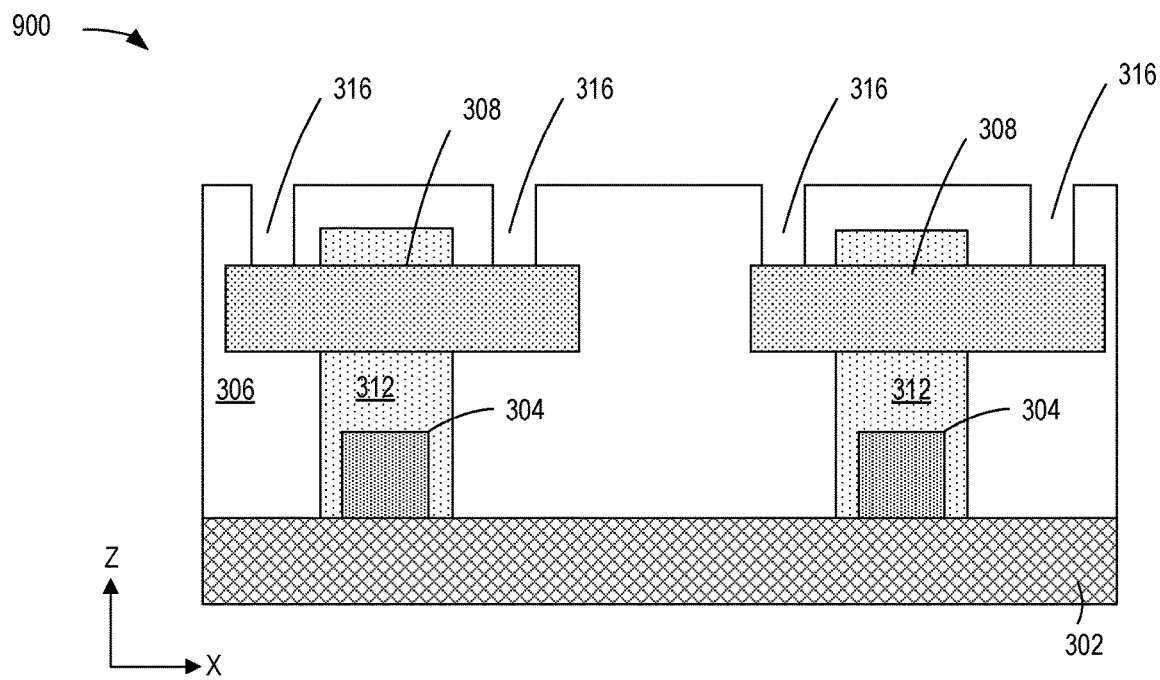
FIGS. 9A & 9B illustrate cross-sectional views of partially formed semiconductor devices with a stacked transistor layout, according to some embodiments.
Figure 9B:
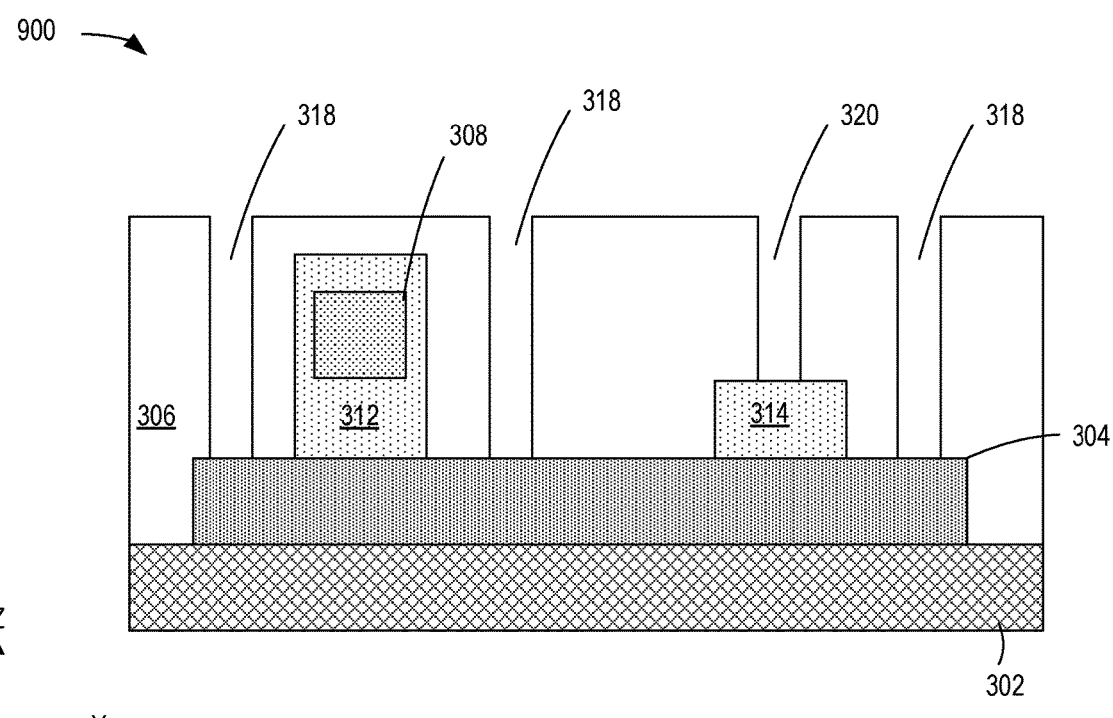

FIGS. 9A & 9B illustrate cross-sectional views of partially formed semiconductor devices with a stacked transistor layout, according to some embodiments. FIGS. 9A & 9B may represent a manufacturing assembly of device 100 as viewed along planes A and B, respectively. As shown, assembly 900 may represent assembly 800 after further processing steps.

Voids 316, 318, and 320 may be formed in dielectric 306 by any suitable technique, including chemical etching or mechanical drilling. In some embodiments, laser ablation may create voids 316, in locations designed to contact transistor bodies 308, voids 318, in locations designed to contact transistor bodies 304, and voids 320, in locations designed to contact gates 314.

Figure 10A:
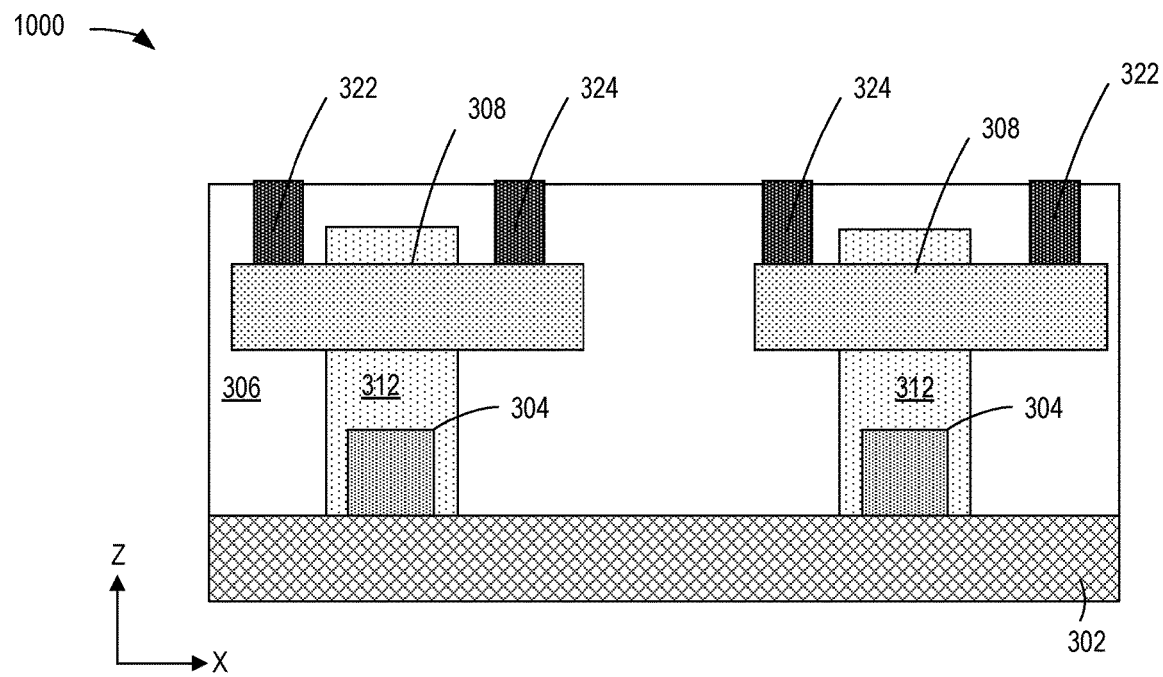
FIGS. 10A & 10B illustrate cross-sectional views of partially formed semiconductor devices with a stacked transistor layout, according to some embodiments.
Figure 10B:
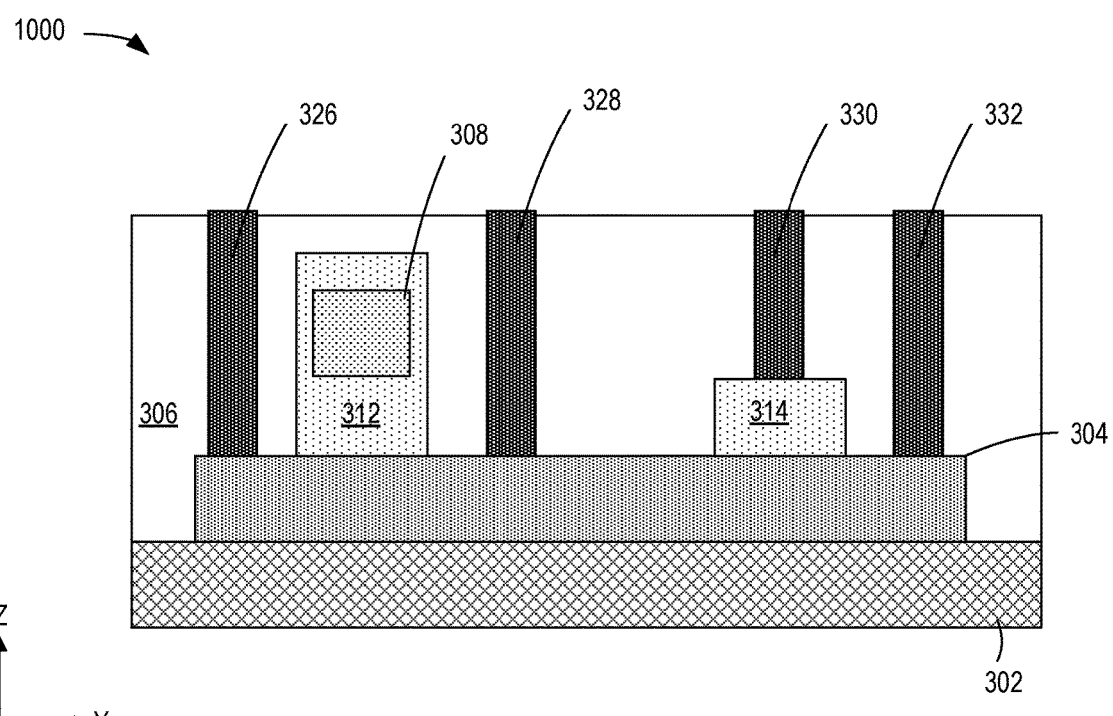

FIGS. 10A & 10B illustrate cross-sectional views of partially formed semiconductor devices with a stacked transistor layout, according to some embodiments. FIGS. 10A & 10B may represent a manufacturing assembly of device 100 as viewed along planes A and B, respectively. As shown, assembly 1000 may represent assembly 900 after further processing steps.

Voids 316, 318, and 320 may be filled with metal to create conductive contacts that may be coupled with higher level interconnects not shown. In some embodiments, contacts 322 may couple source regions of a pull-up transistor in transistor bodies 308 with a voltage source and contacts 324 may couple drain regions in transistor bodies 308 with an interconnect, similar to interconnect 110.

In some embodiments, contacts 326 may couple drain regions of pull-down transistors in transistor bodies 304 with a ground. Contacts 328 may couple both source regions of pull-down transistors and drain regions of access transistors in transistor bodies 304 with an interconnect, similar to interconnect 110, and contacts 332 may couple source regions of access transistors in transistor bodies 304 with a bit line signal.

In some embodiments, contacts 330 may couple gates 314, which may control an access transistor in transistor bodies 304, with a word line signal.

Figure 11:
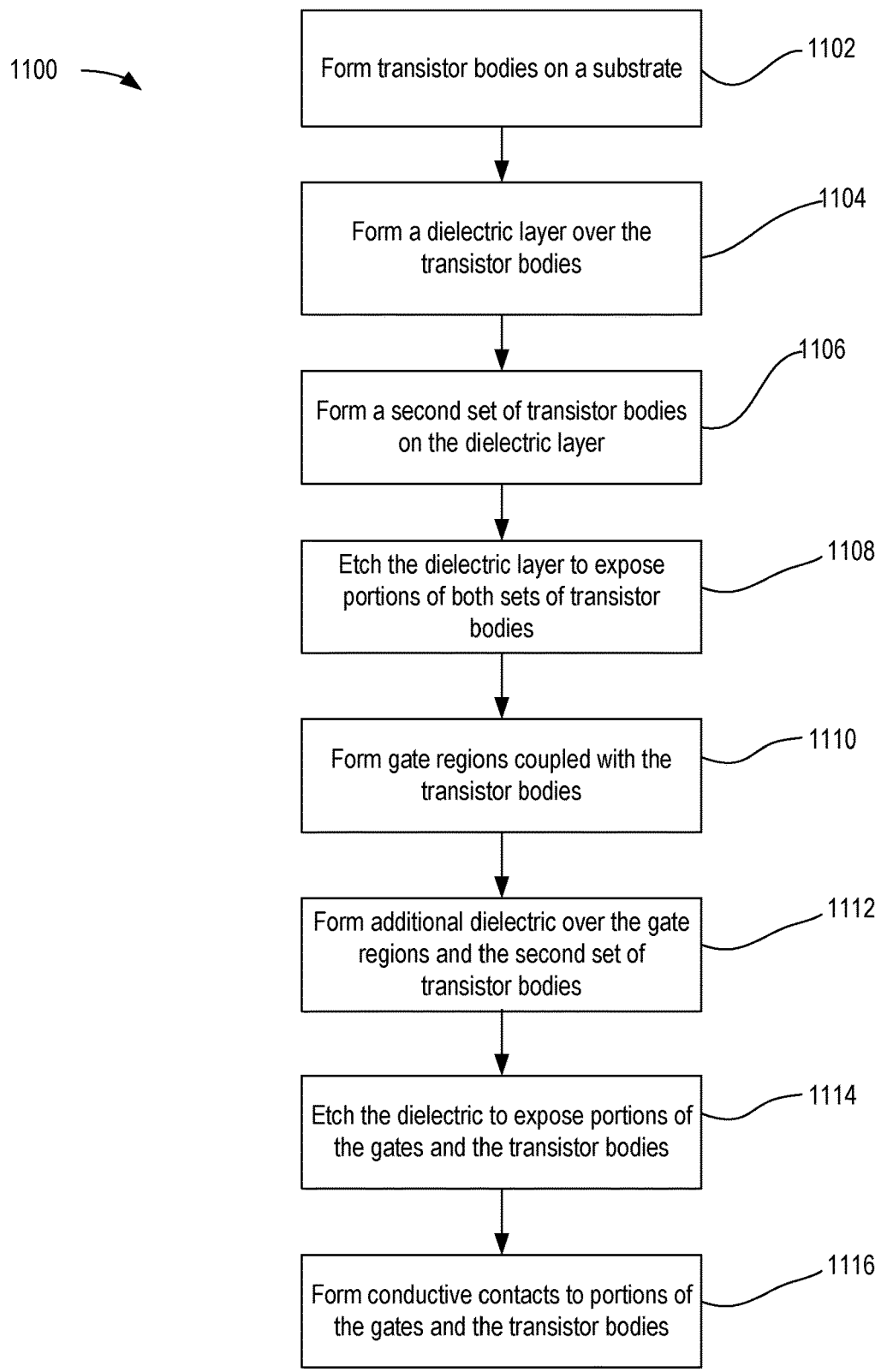
FIG. 11 illustrates a flowchart of a method of forming a semiconductor device with a stacked transistor layout, in accordance with some embodiments.

FIG. 11 illustrates a flowchart of a method of forming a semiconductor device with a thicker dielectric on the drain side, in accordance with some embodiments. Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1100 begins with forming (1102) transistor bodies on a substrate. In some embodiments, transistor bodies 304 may be epitaxially formed in a trench to create fins. In some embodiments, transistor bodies 304 are n-type semiconductor material. Next, a dielectric layer is formed (1104) over the transistor bodies. In some embodiments, dielectric, for example dielectric 306 is deposited by atom layer deposition. In some embodiments, dielectric 306 is silicon dioxide.

Then, a second set of transistor bodies may be formed (1106) on the dielectric. In some embodiments, transistor bodies 308 are p-type semiconductor material. Next, the dielectric layer may be etched (1108) to expose portions of both sets of transistor bodies. In some embodiments, voids 310 are created by selective chemical etchants.

The method continues with forming (1110) gate regions coupled with the transistor bodies. In some embodiments, gates 312 may wrap around transistor bodies 308 and fill the space between transistor bodies 304 and transistor bodies 308. Next, additional dielectric may be formed (1112) over the gate regions and the second set of transistor bodies. In some embodiments, dielectric 306 may be deposited to a height extending above gates 312.

Then the dielectric may be etched (1114) to expose portions of the gates and transistor bodies. In some embodiments, laser drilling may selectively create voids extending to transistor bodies 304, transistor bodies 308, and gates 314. Finally, conductive contacts may be formed (1116) to portions of the gates and the transistor bodies. In some embodiments, voids 316, 318, and 320 are filled with metal by any suitable technique, including electroless plating, for example.

Figure 12:
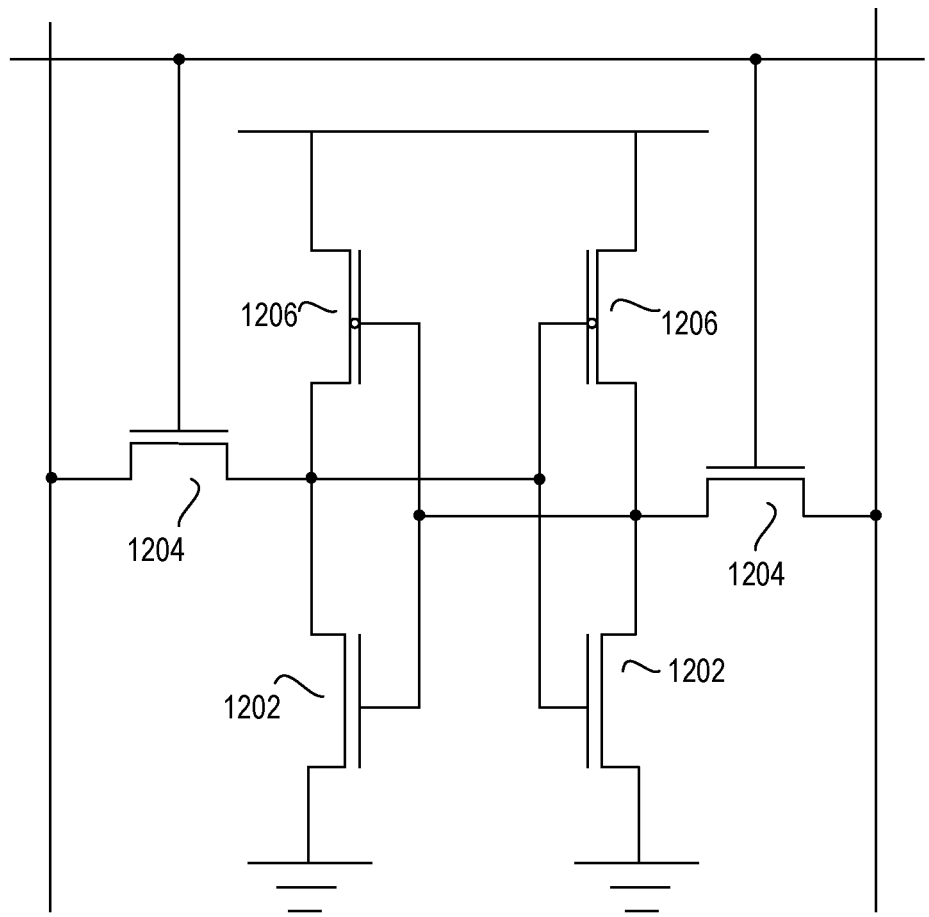
FIG. 12 illustrates a SRAM cell suitable for implementing a stacked transistor layout, in accordance with some embodiments.

FIG. 12 illustrates a SRAM cell suitable for implementing a stacked transistor layout, in accordance with some embodiments. As shown, cell 1200 represents an example 6 transistor (6T) SRAM cell including access transistors 1204, pull-down transistors 1202, and pull-up transistors 1206. In various examples, access transistors 1204, pull-down transistors 1202, and pull-up transistors 1206 may be implemented in a layout as described above. A complete SRAM memory circuit may be formed by interconnecting many SRAM cells such as SRAM cell 1200.

In some embodiments, one or more of access transistors 1204 and pull-down transistors 1202 are NMOS transistors and may include features discussed with respect to NMOS transistors herein and pull-up transistors 1206 are PMOS transistors and may include features discussed with respect to PMOS transistors discussed herein. For example, access transistors 1204 and pull-down transistors 1202 may be implemented in parallel transistor bodies 102 or 304 on a first plane (for example on a substrate) and oriented in a first direction. One or more of pull-up transistors 1206 may be implemented in coaxial transistor bodies 104 or 308 on a second plane (for example on dielectric 306) and oriented in a second direction (for example orthogonally to the NMOS transistor bodies).

Figure 13:
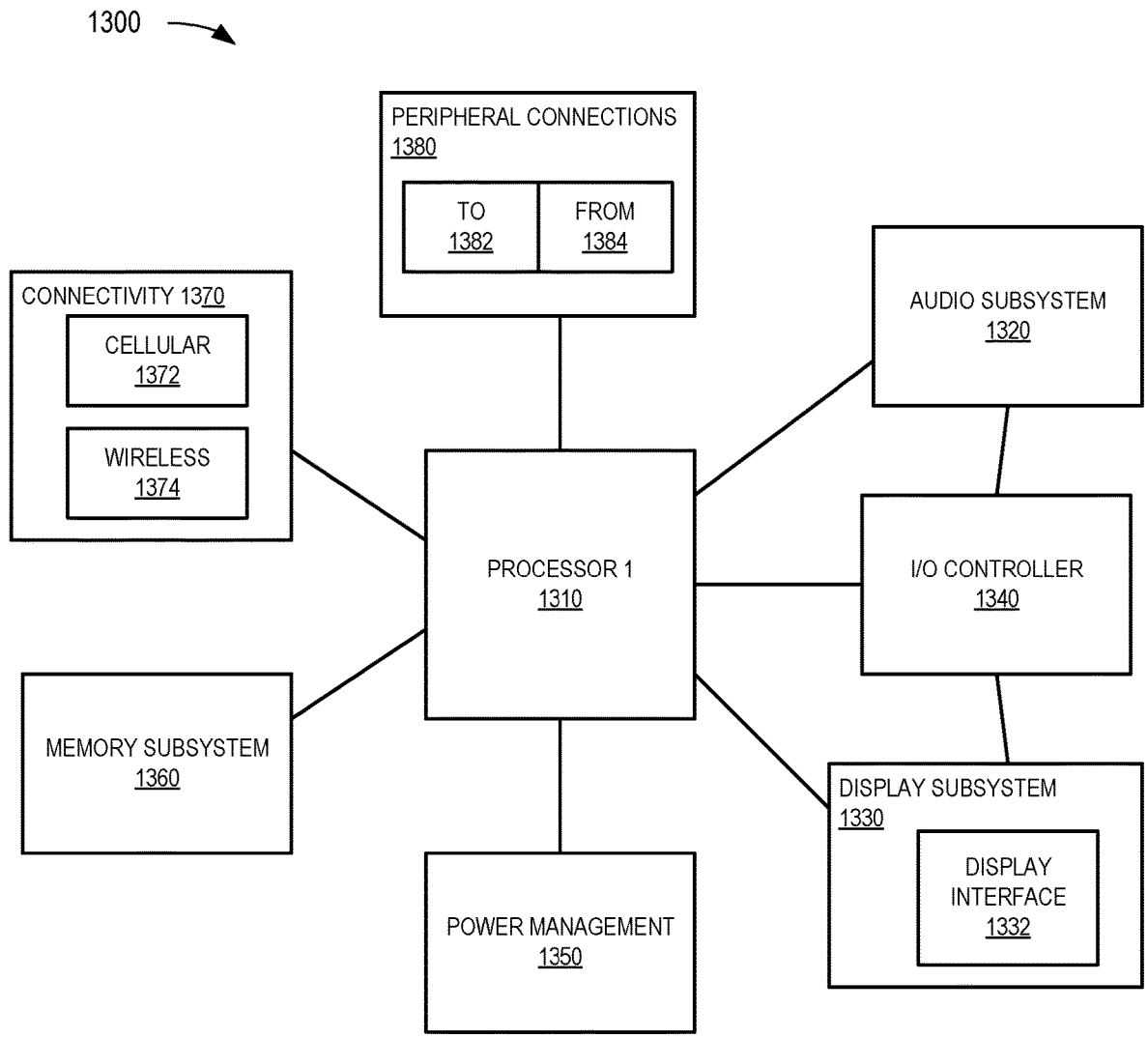
FIG. 13 illustrates a smart device or a computer system or a SoC (System-on-Chip) which includes a semiconductor device with a stacked transistor layout, according to some embodiments.

FIG. 13 illustrates a smart device or a computer system or a SoC (System-on-Chip) 1300 which includes a semiconductor device with a stacked transistor layout, according to some embodiments. In some embodiments, computing device 1300 represents a mobile computing device, such as a computing tablet, a mobile phone or smart-phone, a wireless-enabled e-reader, or other wireless mobile device. It will be understood that certain components are shown generally, and not all components of such a device are shown in computing device 1300. In some embodiments, one or more components of computing device 1300, for example processor 1310 and/or memory subsystem 1360, include a semiconductor device with a stacked transistor layout as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 1300 includes a first processor 1310. The various embodiments of the present disclosure may also comprise a network interface within 1370 such as a wireless interface so that a system embodiment may be incorporated into a wireless device, for example, cell phone or personal digital assistant.

In one embodiment, processor 1310 can include one or more physical devices, such as microprocessors, application processors, microcontrollers, programmable logic devices, or other processing means. The processing operations performed by processor 1310 include the execution of an operating platform or operating system on which applications and/or device functions are executed. The processing operations include operations related to I/O (input/output) with a human user or with other devices, operations related to power management, and/or operations related to connecting the computing device 1300 to another device. The processing operations may also include operations related to audio I/O and/or display I/O.

In one embodiment, computing device 1300 includes audio subsystem 1320, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1300, or connected to the computing device 1300. In one embodiment, a user interacts with the computing device 1300 by providing audio commands that are received and processed by processor 1310.

Display subsystem 1330 represents hardware (e.g., display devices) and software (e.g., drivers) components that provide a visual and/or tactile display for a user to interact with the computing device 1300. Display subsystem 1330 includes display interface 1332, which includes the particular screen or hardware device used to provide a display to a user. In one embodiment, display interface 1332 includes logic separate from processor 1310 to perform at least some processing related to the display. In one embodiment, display subsystem 1330 includes a touch screen (or touch pad) device that provides both output and input to a user.

I/O controller 1340 represents hardware devices and software components related to interaction with a user. I/O controller 1340 is operable to manage hardware that is part of audio subsystem 1320 and/or display subsystem 1330. Additionally, I/O controller 1340 illustrates a connection point for additional devices that connect to computing device 1300 through which a user might interact with the system. For example, devices that can be attached to the computing device 1300 might include microphone devices, speaker or stereo systems, video systems or other display devices, keyboard or keypad devices, or other I/O devices for use with specific applications such as card readers or other devices.

As mentioned above, I/O controller 1340 can interact with audio subsystem 1320 and/or display subsystem 1330. For example, input through a microphone or other audio device can provide input or commands for one or more applications or functions of the computing device 1300. Additionally, audio output can be provided instead of, or in addition to display output. In another example, if display subsystem 1330 includes a touch screen, the display device also acts as an input device, which can be at least partially managed by I/O controller 1340. There can also be additional buttons or switches on the computing device 1300 to provide I/O functions managed by I/O controller 1340.

In one embodiment, I/O controller 1340 manages devices such as accelerometers, cameras, light sensors or other environmental sensors, or other hardware that can be included in the computing device 1300. The input can be part of direct user interaction, as well as providing environmental input to the system to influence its operations (such as filtering for noise, adjusting displays for brightness detection, applying a flash for a camera, or other features).

In one embodiment, computing device 1300 includes power management 1350 that manages battery power usage, charging of the battery, and features related to power saving operation. Memory subsystem 1360 includes memory devices for storing information in computing device 1300. Memory can include nonvolatile (state does not change if power to the memory device is interrupted) and/or volatile (state is indeterminate if power to the memory device is interrupted) memory devices. Memory subsystem 1360 can store application data, user data, music, photos, documents, or other data, as well as system data (whether long-term or temporary) related to the execution of the applications and functions of the computing device 1300.

Elements of embodiments are also provided as a machine-readable medium (e.g., memory 1360) for storing the computer-executable instructions. The machine-readable medium (e.g., memory 1360) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1370 includes hardware devices (e.g., wireless and/or wired connectors and communication hardware) and software components (e.g., drivers, protocol stacks) to enable the computing device 1300 to communicate with external devices. The computing device 1300 could be separate devices, such as other computing devices, wireless access points or base stations, as well as peripherals such as headsets, printers, or other devices.

Connectivity 1370 can include multiple different types of connectivity. To generalize, the computing device 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1374 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1380 include hardware interfaces and connectors, as well as software components (e.g., drivers, protocol stacks) to make peripheral connections. It will be understood that the computing device 1300 could both be a peripheral device ("to" 1382) to other computing devices, as well as have peripheral devices ("from" 1384) connected to it. The computing device 1300 commonly has a "docking" connector to connect to other computing devices for purposes such as managing (e.g., downloading and/or uploading, changing, synchronizing) content on computing device 1300. Additionally, a docking connector can allow computing device 1300 to connect to certain peripherals that allow the computing device 1300 to control content output, for example, to audiovisual or other systems.

In addition to a proprietary docking connector or other proprietary connection hardware, the computing device 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an integrated circuit device structure is provided comprising: a first transistor body comprising one or more semiconductor materials, the first transistor body comprising: a first source region; a first drain region; and a first channel region between the first source region and the first drain region, wherein the first source region, the first drain region, and the first channel region are located along a first lengthwise direction of the first transistor body; a first dielectric layer over the first transistor body; a second transistor body comprising one or more semiconductor materials, the second transistor body over the first dielectric layer, the second transistor body comprising: a second source region; a second drain region; and a second channel region between the second source region and the second drain region, wherein the second source region, the second drain region, and the second channel region are located along a second lengthwise direction of the second transistor body, wherein the second lengthwise direction is non-parallel to the first lengthwise direction; and a gate coupled with the first channel region and the second channel region.

In some embodiments, the gate extends between the first transistor body and the second transistor body. In some embodiments, the gate comprises a longitudinal axis that is oriented at an angle of about 45 degrees with the second lengthwise direction. In some embodiments, the second lengthwise direction is orthogonal to the first lengthwise direction. In some embodiments, the first transistor body comprises a n-type semiconductor material and the second transistor body comprises a p-type semiconductor material. Some embodiments also include a contact that couples the first source region with the second drain region. In some embodiments, the contact further couples with a gate of a third transistor body and a fourth transistor body. In some embodiments, the contact comprises a wire that is oriented at an angle of about 45 degrees with the second lengthwise direction. In some embodiments, the second transistor body is coaxial with a third transistor body. In some embodiments, the gate comprises polycrystalline silicon. In some embodiments, the first transistor body and the second transistor body comprise doped silicon.

In another example, a static random access memory (SRAM) is provided comprising: a NMOS transistor body on a first plane, the NMOS transistor body having a first body orientation; a PMOS transistor body on a second plane, the PMOS transistor body having a second body orientation, wherein the first plane and the second plane are separated by a dielectric layer, and wherein the first body orientation is orthogonal to the second body orientation; and a gate coupled with the NMOS transistor body and the PMOS transistor body at an intersection.

In another example, a system in some embodiments, the gate comprises a longitudinal axis that is oriented at an angle of about 45 degrees with the second transistor body. Some embodiments also include a contact that couples the source region of the first transistor body with the drain region of the second transistor body. In some embodiments, the contact comprises a wire that is oriented at an angle of about 45 degrees with the second transistor body. In some embodiments, the contact further couples with a gate of a second NMOS transistor body and a second PMOS transistor body. In some embodiments, the first PMOS transistor body is coaxial with the second PMOS transistor body.

In another example, a system is provided comprising: a display subsystem; a wireless communication interface; and an integrated circuit device, the integrated circuit device comprising: a first transistor body comprising a source region and a drain region with a channel region therebetween; a first dielectric layer over the first transistor body; a second transistor body comprising a source region and a drain region with a channel region therebetween, wherein the second transistor body is over the first dielectric layer and wherein the second transistor body is orthogonal to the first transistor body; a second dielectric layer over the second transistor body; and a gate that couples with both the first transistor body and the second transistor body.

In some embodiments, the gate extends between the first transistor body and the second transistor body. In some embodiments, the gate comprises a longitudinal axis that is oriented at an angle of about 45 degrees with the second transistor body. Some embodiments also include a contact that couples the source region of the first transistor body with the drain region of the second transistor body. In some embodiments, the contact further couples with a gate of a third transistor body and a fourth transistor body. In some embodiments, the second transistor body is coaxial with the third transistor body. In some embodiments, the gate comprises polycrystalline silicon. In some embodiments, the first transistor body and the second transistor body comprise doped silicon.

In another example, a method for fabricating an integrated circuit device structure is provided comprising: forming a first transistor body on a substrate, the first transistor body comprising one or more semiconductor materials and having a length comprising a source region and a drain region with a channel region therebetween; forming a first dielectric layer over the first transistor body; forming a second transistor body over the first dielectric layer, the second transistor body comprising one or more semiconductor materials and having a length comprising a source region and a drain region with a channel region therebetween, wherein the length of the second transistor body is non-parallel to the length of the first transistor body; and forming a gate coupled with the channel regions of both the first transistor body and the second transistor body.

In some embodiments, forming the gate comprises: removing portions of the dielectric layer from between the first transistor body and the second transistor body; and forming the gate between the first transistor body and the second transistor body. In some embodiments, forming the second transistor body comprises forming the second transistor body with the length of the second transistor body orthogonal to the length of the first transistor body. In some embodiments, forming the first transistor body comprises forming a fin of n-type semiconductor material, and wherein forming the second transistor body comprises forming a fin of p-type semiconductor material. Some embodiments also include forming a second gate coupled with a second channel region of the first transistor body. Some embodiments also include forming a contact coupled with the drain region of the second transistor body and the source region of the first transistor body. Some embodiments also include forming a third transistor body on the substrate, the third transistor body symmetrical to and parallel with the first transistor body. Some embodiments also include forming a fourth transistor body on the dielectric layer, the fourth transistor body symmetrical to and coaxial with the second transistor body.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit device structure comprising:
   a first transistor body comprising one or more semiconductor materials, the first transistor body comprising:
      a first source region;
      a first drain region; and
      a first channel region between the first source region and the first drain region, wherein the first source region, the first drain region, and the first channel region are located along a first lengthwise direction of the first transistor body;
   a second transistor body comprising one or more semiconductor materials, the second transistor body comprising a second channel region that is over the first channel region, and the second transistor body further comprising:
      a second source region; and
      a second drain region, wherein the second source region, the second drain region, and the second channel region are located along a second lengthwise direction of the second transistor body, and wherein the second lengthwise direction is non-parallel to the first lengthwise direction; and
   a gate coupled with both the first channel region and the second channel region, wherein the gate has a longitudinal axis non-parallel and non-orthogonal to both the first and second lengthwise directions.

2. The integrated circuit device structure of claim 1, wherein the gate is between the first channel region and the second channel region.

3. The integrated circuit device structure of claim 2, wherein the gate longitudinal axis is oriented at an angle of about 45 degrees from the first and second lengthwise directions.

4. The integrated circuit device structure of claim 2, wherein the second lengthwise direction is orthogonal to the first lengthwise direction.

5. The integrated circuit device structure of claim 2, wherein the first transistor body comprises a n-type semiconductor material and the second transistor body comprises a p-type semiconductor material.

6. The integrated circuit device structure of claim 2, further comprising a contact that couples the first source region with the second drain region.

7. The integrated circuit device structure of claim 6, wherein the contact further couples with a gate of a third transistor body and a fourth transistor body.

8. The integrated circuit device structure of claim 6, wherein the contact comprises a wire that is oriented at an angle of about 45 degrees with the second lengthwise direction.

9. The integrated circuit device structure of claim 6, wherein the second transistor body is coaxial with a third transistor body.

10. The integrated circuit device structure of claim 6, wherein the gate is coupled to a second contact that is further coupled to a source or drain region of a third transistor body.

11. The integrated circuit device structure of claim 6, wherein the first transistor body and the second transistor body comprise silicon.

12. A static random access memory (SRAM) comprising:
a NMOS transistor body on a first plane, the NMOS transistor body having a first body orientation;
a PMOS transistor body on a second plane, the PMOS transistor body having a second body orientation, wherein the first body orientation is orthogonal to the second body orientation; and
a gate coupled with a first channel region of the NMOS transistor body and a second channel region of the PMOS transistor body at an intersection where the first channel region overlaps the second channel region, wherein the gate has a longitudinal axis non-parallel and non-orthogonal to both the first and second body orientations.

13. The SRAM of claim 12, wherein the gate longitudinal axis is oriented at an angle of about 45 degrees with the second transistor body.

14. The SRAM of claim 12, further comprising a contact that couples the source region of the first transistor body with the drain region of the second transistor body.

15. The SRAM of claim 14, wherein the contact comprises a wire that is oriented at an angle of about 45 degrees with the second transistor body.

16. The SRAM of claim 14, wherein the contact further couples with a gate of a second NMOS transistor body and a second PMOS transistor body.

17. The SRAM of claim 16, wherein the first PMOS transistor body is coaxial with the second PMOS transistor body.

18. A system comprising:
a display subsystem;
a wireless communication interface; and
an integrated circuit device, the integrated circuit device comprising:
a first transistor body comprising a source region and a drain region with a channel region therebetween;
a second transistor body comprising a source region and a drain region with a channel region therebetween, wherein the second transistor body is over, and orthogonal to, the first transistor body; and
a gate that couples with both the first transistor body and the second transistor body at an intersection where the first transistor body overlaps the second transistor body, wherein the gate has a longitudinal axis non-parallel and non-orthogonal to both the first transistor body and the second transistor body.

19. The system of claim 18, wherein the gate extends between the first transistor body and the second transistor body.

20. The system of claim 18, wherein:
the gate has a longitudinal axis that is oriented at an angle of about 45 degrees with the second transistor body;
a contact couples the source region of the first transistor body with the drain region of the second transistor body;
the contact further couples with a gate of a third transistor body and a fourth transistor body;
the second transistor body is coaxial with the third transistor body.

* * * * *